(12) United States Patent
Rowley (10) Patent No.: US 11,073,855 B2
(45) Date of Patent: Jul. 27, 2021

(54) CAPACITOR-BASED POWER CONVERTER WITH BUCK CONVERTER

(71) Applicant: Micron Technology, Inc., Boise, ID (US)

(72) Inventor: Matthew D. Rowley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/525,393

(22) Filed: Jul. 29, 2019

(65) Prior Publication Data

US 2021/0034086 A1 Feb. 4, 2021

(51) Int. Cl.
| | | |
|---|---|---|
| H02M 3/18 | (2006.01) | |
| G05F 1/575 | (2006.01) | |
| H02M 3/158 | (2006.01) | |
| H02M 1/00 | (2006.01) | |

(52) U.S. Cl.
CPC ............ *G05F 1/575* (2013.01); *H02M 3/158* (2013.01); *H02M 3/18* (2013.01); *H02M 2001/007* (2013.01); *H02M 2001/0045* (2013.01); *H02M 2001/0067* (2013.01)

(58) Field of Classification Search
CPC .................. G05F 1/575; H02M 3/158; H02M 2001/0045; H02M 2001/0067; H02M 2001/007; H02M 3/18; H03K 2217/0081
See application file for complete search history.

(56) References Cited

U.S. PATENT DOCUMENTS

| 10,482,979 | B1 * | 11/2019 | Rowley ................... G05F 1/462 |
| 2004/0174763 | A1 | 9/2004 | Schnepper |
| 2006/0203556 | A1 * | 9/2006 | Chen ....................... G11C 16/30 365/185.18 |
| 2011/0066765 | A1 * | 3/2011 | Mochizuki .......... G06F 13/1684 710/14 |
| 2012/0139516 | A1 | 6/2012 | Tsai et al. |
| 2013/0141062 | A1 | 6/2013 | Khlat |
| 2019/0312514 | A1 * | 10/2019 | Hukel ..................... H02M 3/07 |

FOREIGN PATENT DOCUMENTS

| CN | 104753344 | 7/2015 |
| JP | 2007074797 | 3/2007 |

OTHER PUBLICATIONS

"International Application Serial No. PCT US2020 043309, International Search Report dated Oct. 30, 2020", 3 pgs.
"International Application Serial No. PCT US2020 043309, Written Opinion dated Oct. 30, 2020", 3 pgs.

* cited by examiner

*Primary Examiner* — Kyle J Moody
*Assistant Examiner* — Jye-June Lee
(74) *Attorney, Agent, or Firm* — Schwegman Lundberg & Woessner, P.A.

(57) ABSTRACT

Various embodiments described herein provide a system that uses a capacitor-based power converter to generate a gate voltage (e.g., boot strap voltage) for a buck converter. According to various embodiments described herein, the capacitor-based power converter includes at least one of a combination of a capacitive voltage divider circuit with a low-dropout (LDO) regulator, or a combination of a capacitive doubler circuit with an LDO regulator, to generate the gate voltage for the buck converter.

16 Claims, 4 Drawing Sheets

CAPACITOR-BASED POWER CONVERTER WITH BUCK CONVERTER

TECHNICAL FIELD

Embodiments of the disclosure relate generally to power converters and more specifically, relate to capacitor-based power conversion that can be used with an electronic system, such as a memory sub-system.

BACKGROUND

A memory sub-system can be a storage device, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to a capacitor-based power conversion that can be used in a power system of an electronic system, such as a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

Electronic systems, such as memory sub-systems, typically include a power system to power various components of the electronic system. The power system can be implemented using one or more high-voltage devices (e.g., metal-oxide-semiconductor field-effect (MOSFET) transistors), which can implement aspects of the power system, such as a power management controller or a power backup controller. For example, a power system (e.g., a power management controller of the power system) can include a buck converter implemented using two NMOS devices (e.g., transistors) arranged such that there is an upper NMOS device and a lower NMOS device to provide dual output stages. Generally, these NMOS devices of the buck converter work efficiently when the upper NMOS device receives a gate voltage (e.g., boot strap voltage) that ensures that the upper NMOS device is turned on completely. To achieve this, conventional power systems include and use either a low-dropout (LDO) regulator that receives a high voltage and generates a gate voltage for the upper NMOS device, or an additional buck converter to generate a gate voltage for the upper NMOS device. Unfortunately, using an LDO regulator can be inefficient, and using an additional buck converter (while more efficient than using an LDO regulator) can occupy a large amount of space on an integrated circuit (IC) die of the power system (e.g., an IC die implementing a power management controller or a power backup controller) and can also require additional circuit components that increase the overall cost of manufacturing the power system.

Aspects of the present disclosure address the above and other deficiencies by having a system that uses a capacitor-based power converter to generate a gate voltage (e.g., boot strap voltage) for a buck converter. According to various embodiments described herein, the capacitor-based power converter includes at least one of a combination of a capacitive voltage divider circuit with (e.g., coupled to) a low-dropout (LDO) regulator, or a combination of a capacitive doubler circuit with (e.g., coupled to) an LDO regulator, to generate the gate voltage for the buck converter. With the capacitive voltage doubler circuit, a power system can boost the voltage being received by the capacitor-based power converter from a power supply input. For instance, where 3.3V is supplied by a power supply to a power system of an embodiment system (e.g., a memory sub-system), a capacitive doubler circuit can be used to generate 6.6V, which can be lowered to a second voltage (e.g., 5V) via the LDO regulator. With the capacitive voltage divider circuit, a power system can lower (e.g., buck) the voltage being received by the capacitor-based power converter from a power supply input. For instance, where 12V is supplied by a power supply to a power system of an embodiment system (e.g., a memory sub-system), a capacitive divider circuit that includes 12 capacitors can be used to generate a 6V output, which can be lowered to a second voltage (e.g., 5V) via the LDO regulator. The second voltage (e.g., 5V) generated can be used within the power system as a gate voltage (e.g., boot strap voltage) for a buck converter of the power system.

Accordingly, in comparison to conventional solutions for generating a gate voltage for a buck converter, various embodiments described herein can provide a solution (e.g., on an integrated circuit die) for generating a gate voltage for a buck converter with better efficiency, lower cost, smaller foot die print, or some combination thereof. Further, various embodiments described herein can enable a single power component (e.g., power management controller or a power backup controller) to flexibly support generation of a gate voltage for a buck converter using two or more different power supply voltages (e.g., generate 6V using a capacitive circuit based on a 12V power supply or a 3.3V power supply supplied to the single power component). For example, an embodiment having a dual mode (e.g., one mode using a capacitive doubler circuit and another mode using a capacitive divider circuit) can support generating a gate voltage based on a high voltage or based on a lower voltage.

As used herein, a buck converter can include a direct-current-to-direct current (DC-to-DC) power converter that steps down voltage from its input (supply input) to its output (voltage output to a load). A buck converter can be implemented using at least two semiconductor devices, such as two NMOS transistors. As used herein, a low-dropout (LDO) regulator can include a device capable of maintaining a specified output voltage based on a wide range of input voltages. There can be a very small difference voltage drop between the input voltage to an LDO regulator and the output voltage of the LDO regulator. As used herein, a capacitive doubler circuit can include a charge pump circuit. As used herein, a capacitive divider circuit can include a capacitive voltage divider circuit. Additionally, as used herein, an input can include a pin, connector, or a node of a circuit, and an output can include a pin, connector, or a node of a circuit.

Disclosed herein are some examples of systems that include or use a capacitor-based power converter to generate a gate voltage for a buck converter, which can be used in a power system for a memory sub-system, as described herein.

Figure 1:
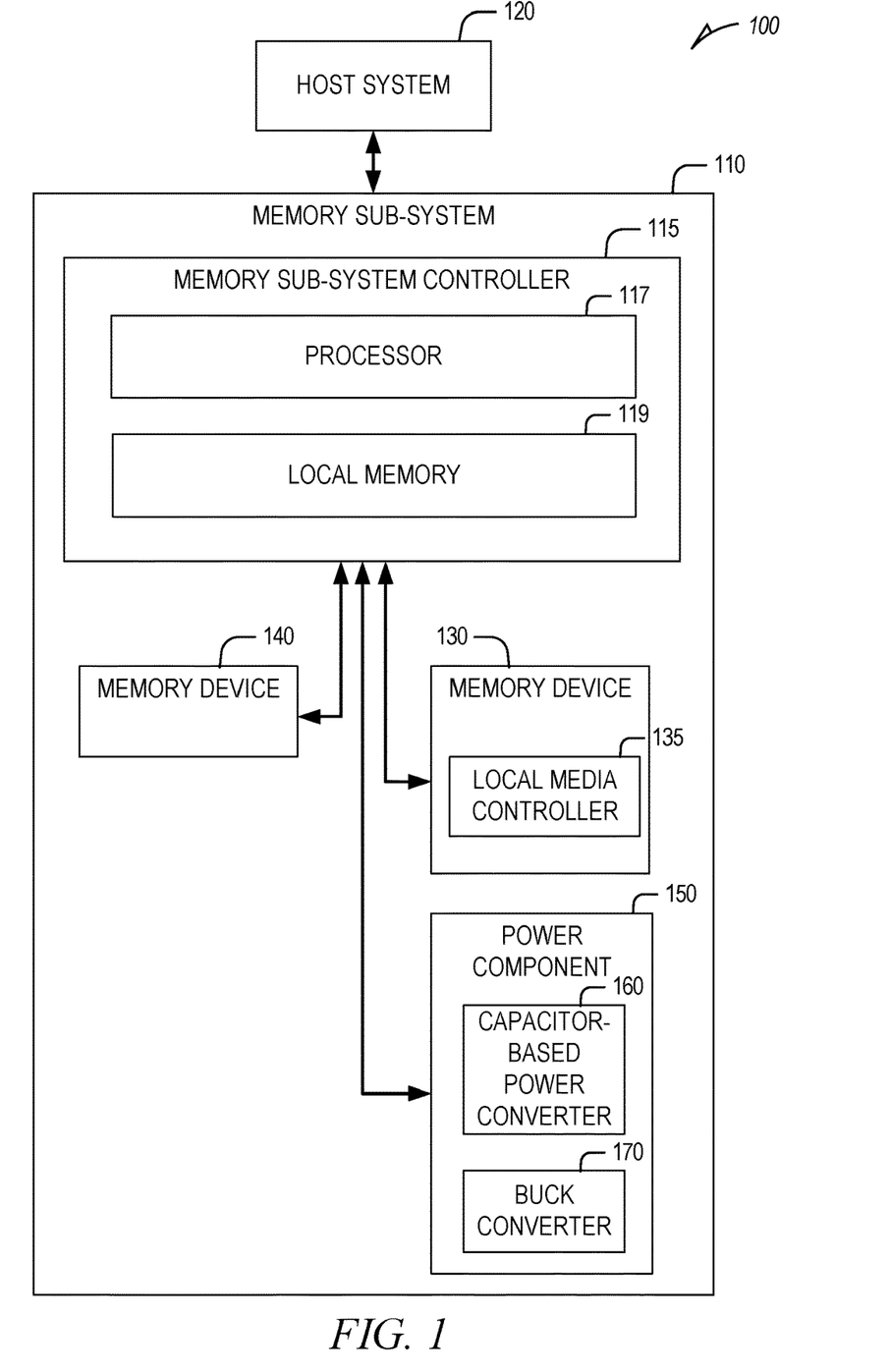
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a negative-and (NAND) type flash memory. Each of the memory devices 130 can include one or more arrays of memory cells such as single-level cells (SLCs) or multi-level cells (MLCs) (e.g., triple-level cells (TLCs) or quad-level cells (QLCs)). In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or memory blocks that can refer to a unit of the memory component used to store data.

Although non-volatile memory components such as NAND type flash memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130.

As shown, the memory sub-system 110 includes a power component 150 that can provide (or cause power to be provided) to various components of the memory sub-system 110, such as the memory sub-system controller 115. Depending on the embodiment, the power component 150 can represent a power backup controller or a power management controller of the memory sub-system 110, such as a power management integrated circuit (IC) that can manage and adjust power usage of the memory sub-system 110. Though not shown, the power component 150 can be part of a larger power system used by the memory sub-system 110, where the power system that receives primary power from the host system 120, that includes power backup components (e.g., power backup controller and power backup capacitor banks), and that can provide various components of the memory sub-system 110 with power from either the primary power interface or a backup power source in the event of primary power loss to the memory sub-system 110.

As also shown, the power component 150 includes a capacitor-based power converter 160 and a buck converter 170. The power component 150 implements aspects of various embodiments described herein. According to some embodiments, the capacitor-based power converter 160 generates a gate voltage (e.g., boot strap voltage) for the buck converter 170 (e.g., upper transistor of the buck converter 170), which can be included by the power component 150 or a larger power system of the memory sub-system 110. The capacitor-based power converter 160 can include at least one of a combination of a capacitive voltage divider circuit with (e.g., coupled to) a low-dropout (LDO) regulator, or a combination of a capacitive doubler circuit with (e.g., coupled to) an LDO regulator, to generate the gate voltage for the buck converter 170. For some embodiments, the power component 150 receives power from the host system 120 via a power supply input. Based on the level of voltage received by the power supply input, the capacitor-based power converter 160 can use its capacitive voltage doubler circuit to boost the voltage received by the power supply input, or the capacitor-based power converter 160 can use its capacitive voltage divider circuit to lower (e.g., buck) the voltage received by the power supply input. The capacitive voltage doubler circuit can be used in response to a voltage, provided by a supply voltage (of the buck converter 170) to the buck converter 170, being higher than the voltage provided to the capacitor-based power converter 160 by the power supply input. The capacitive voltage divider circuit can be used in response to voltage, provided by a supply voltage (of the buck converter 170) to the buck converter 170, being lower than the voltage provided to the capacitor-based power converter 160 by the power supply input. The voltage provided by the capacitor-based power converter 160 to the buck converter 170 can be used by as a gate voltage for at least one semiconductor device of the buck converter, such as an upper transistor device.

Figure 2:
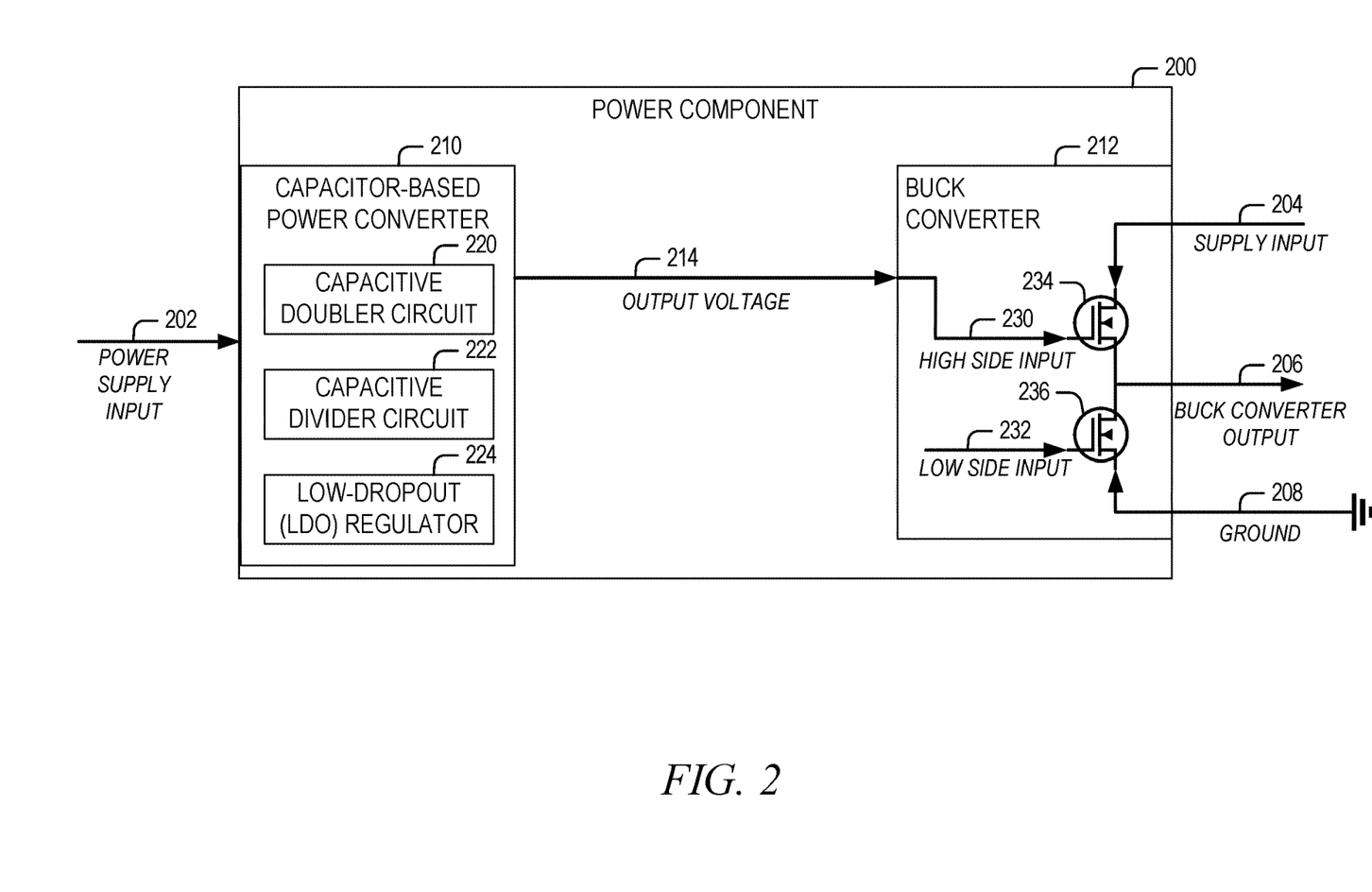
FIG. 2 is a block diagram of an example power component including a capacitor-based power converter and a buck converter, in accordance with some embodiments of the present disclosure.

FIG. 2 is a block diagram of an example power component 200 including a capacitor-based power converter 210 and a buck converter 212, in accordance with some embodiments of the present disclosure. As shown, the capacitor-based power converter 210 is coupled to the buck converter 212, which enables the capacitor-based power converter 210 to provide an output voltage to the buck converter 212 via a connection 214. In this way, the capacitor-based power converter 210 can operate as a boot strap converter that provides a boot strap voltage to the buck converter 212. Though the capacitor-based power converter 210 is illustrated as including both 210 and 212, for some embodiments, the capacitor-based power converter 210 includes just one or the other. The capacitor-based power converter 210 receives power (e.g., from host system 120) as a power supply input via connection 202, and generates the output voltage to the buck converter 212 based on the power from the power supply input. The capacitor-based power converter 210 includes a capacitive doubler circuit 220, a capacitive divider circuit 222, and a lower-dropout (LDO) regulator 224. According to various embodiments, based on voltage provided to the capacitor-based power converter 210 via the connection 202, the capacitor-based power converter 210 uses either the capacitive doubler circuit 220 and the LDO regulator 224 to generate the output voltage on the connection 214, or the capacitive divider circuit 222 and the LDO regulator 224 to generate the output voltage on the connection 214. For example, where a supply input voltage provided to the buck converter 212 via a connection 204 is higher than the voltage provided to the buck converter 212 via the connection 202, the capacitor-based power converter 210 can use the capacitive doubler circuit 220 and the LDO regulator 224 to boost the voltage provided via the connection 202 to generate the output voltage on the connection 214. Where a supply input voltage provided to the buck converter 212 via the connection 204 is lower than the voltage provided to the buck converter 212 via the connection 202, the capacitor-based power converter 210 can use the capacitive divider circuit 222 and the LDO regulator 224 to lower (e.g., buck) the voltage provided via the connection 202 to generate the output voltage on the connection 214.

As shown, the buck converter 212 includes a n-channel transistor device 234 (e.g., an NMOS transistor) and a n-channel transistor device 236 (e.g., an NMOS transistor), each of which is coupled together. The n-channel transistor device 234 can represent a high-side transistor device of the buck converter 212, and the n-channel transistor device 236 can represent a low-side transistor device of the buck converter 212. The buck converter 212 uses the output voltage received from the capacitor-based power converter 210 (via the connection 214) as a gate drive voltage (high side input 230) for the transistor device 234 (e.g., high-side transistor device of the buck converter 212). The n-channel transistor device 236 receives a gate voltage (as a low side input) via a connection 232. As illustrated, the source of the n-channel transistor device 234 is coupled to the drain of the n-channel transistor device 236. The connection 204 provides a supply input to the drain of the n-channel transistor device 234, a connection 208 couples the source of the n-channel transistor device 236 to ground, and the node connecting the n-channel transistor device 234 to the n-channel transistor device 236 provides a buck converter output voltage via a connection 206. For some embodiments, the number, type, and arrangement of transistor devices included and used by the buck converter 212 can vary from what is illustrated by FIG. 2. Depending on the embodiments, the buck converter output voltage provided by the buck converter 212 via the connection 206 can be used to power one or more components of a memory sub-system (e.g., 110), such as a memory sub-system controller (e.g., 115) or a memory device (e.g., 130).

Figure 3:
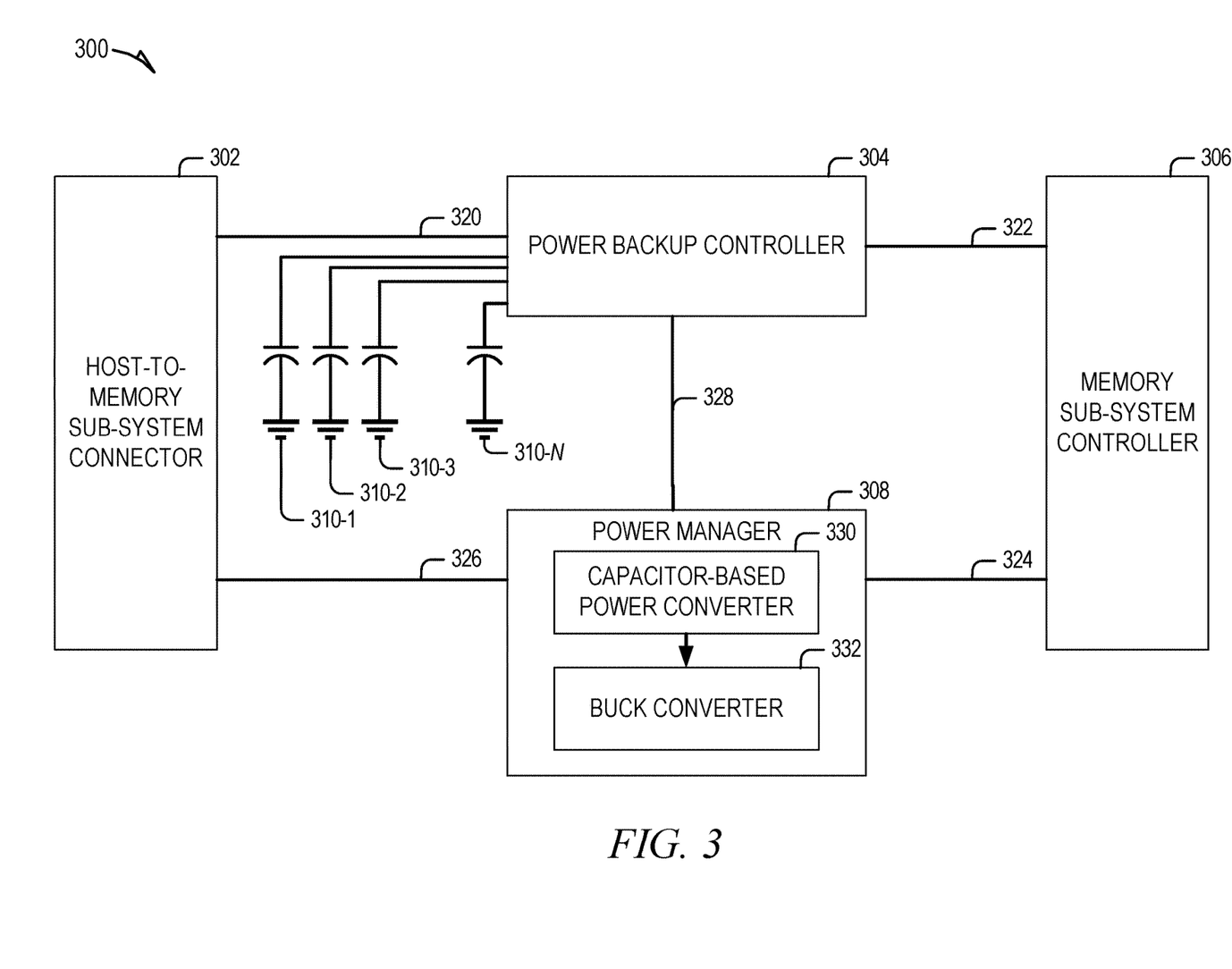
FIG. 3 is a diagram of an example power manager of a memory sub-system that includes a capacitor-based power converter and a buck converter, in accordance with some embodiments of the present disclosure.

FIG. 3 is a diagram of an example power manager of a memory sub-system (e.g., 110) that includes a capacitor-based power converter 330 and a buck converter 332, in accordance with some embodiments of the present disclosure. In particular, the power architecture 300 includes a host-to-memory-sub-system connector 302, a power backup controller 304, a memory sub-system controller 306, a power manager 308, and a set of capacitor sets 310-1 to 310-N. For some embodiments, the power manager 308 includes a power management integrated circuit (IC). Additionally, for some embodiments, the memory sub-system controller 306 includes the memory sub-system controller 115 described above with respect to FIG. 1. As used herein, a capacitor set can refer to a grouping of one or more capacitors. For instance, a single capacitor set can include a capacitor bank. For some embodiments, the capacitor set includes two or more capacitors of a similar capacitance rating, where the two or more capacitors are arranged in series, in parallel, or some combination thereof. Each capacitor can include a high-voltage capacitor suitable for providing backup power to an electronic system.

The host-to-memory-sub-system connector 302 can include one or more hardware interfaces that permit a memory sub-system (e.g., 110) to operatively couple to a host system (e.g., 120), thereby facilitating data operations between the memory sub-system and the host system. Coupling 320 operatively couples the host-to-memory-sub-system connector 302 to the power backup controller 304, and coupling 326 operatively couples the host-to-memory-sub-system connector 302 to the power manager 308. The coupling 320 can include a host power connection, thereby providing the power backup controller 304 with primary power provided to the memory sub-system (by a host system) via the host-to-memory-sub-system connector 302. The coupling 326 can include one or more input/output (I/O) connections (e.g., general purpose input output (GPIO), I2C).

As shown, coupling 328 operatively couples the power backup controller 304 and the power manager 308. The coupling 328 can include one or more I/O connections (e.g., GPIO, I2C), a power connection that permits the power backup controller 304 to provide power to the power manager 308, and a connection for the power backup controller 304 to signal the power manager 308 that there is a loss of power from the host system.

As shown, the power manager 308 includes the capacitor-based power converter 330 and the buck converter 332. According to various embodiments, the capacitor-based power converter 330 and the buck converter 332 implement aspects/features of the power component 200 (described above with respect to FIG. 2) as part of the power manager 308. For some embodiments, the voltage generated by the capacitor-based power converter 330 and the buck converter 332 is based on power provided to the power manager 308 by the power backup controller 304 via coupling 328.

Additionally, for some embodiments, voltage provided to the memory sub-system controller 306 via coupling 324 can be generated, as least in part, using the capacitor-based power converter 330 and the buck converter 332 of the power manager 308.

As illustrated, coupling 322 operatively couples the power backup controller 304 and the memory sub-system controller 306. The coupling 322 can include: one or more I/O connections (e.g., GPIO, I2C); and a connection for the power backup controller 304 to signal the memory sub-system controller 306 that there is a loss of power from the host system. Coupling 324 operatively couples the memory sub-system controller 306 and the power manager 308. The coupling 324 can include one or more I/O connections (e.g., GPIO, I2C).

As shown, the power backup controller 304 is coupled to the set of capacitor sets 310-1 to 310-N, where each capacitor set 310 can be coupled to a separate pin of the power backup controller 304. Through a given pin coupled to a given capacitor set 310, the power backup controller 304 can charge, discharge, or test the given capacitor set 310. In the event of a loss of primary power from a host system via the host-to-memory-sub-system connector 302, the power backup controller 304 can switch power to the memory sub-system controller 306 and the power manager 308 from the primary power (being received via coupling 320) to power provided by the set of capacitor sets 310-1 to 310-N.

Figure 4:
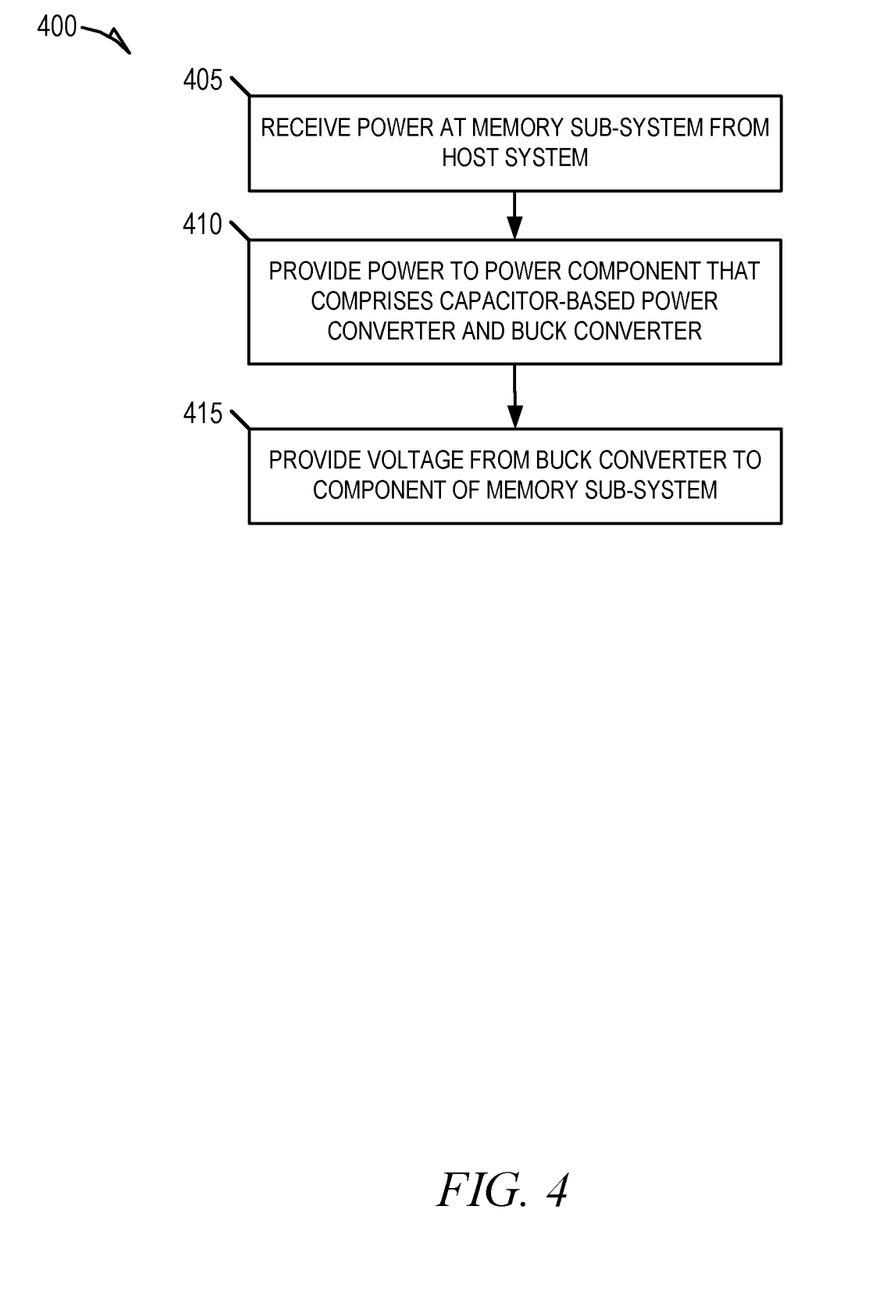
FIG. 4 is a flow diagram of an example method for using a capacitor-based power converter with a memory sub-system, in accordance with some embodiments of the present disclosure.

FIG. 4 is a flow diagram of an example method 400 for using a capacitor-based power converter with a memory sub-system, in accordance with some embodiments of the present disclosure. The method 400 can be performed with the assistance of processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed at least in part by the power component 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, a memory sub-system (e.g., 110) receives power from a host system (e.g., 120) via a physical interface, such as a host-to-memory-sub-system connector (e.g., 302). This power can represent a primary power source for the memory sub-system and be separate from power that can be provided by a backup power source (e.g., one or more capacitor sets 310) that is included by the memory sub-system.

At operation 410, the memory sub-system provides at least a portion of the power from the host system to a power component (e.g., 150 or 200) of the memory sub-system, where the power component comprises a capacitor-based power converter (e.g., 160 or 210) and a buck converter (e.g., 170 or 212) coupled to the power converter voltage output of the capacitor-based power converter. According to various embodiment, the capacitor-based power converter (e.g., 210) comprises a power supply input (e.g., 202), a capacitive circuit (e.g., at least one of 220 or 222) coupled to the power supply input, a low-dropout regulator (e.g., 224) coupled to the capacitive circuit, and a power converter voltage output coupled to the low-dropout regulator (e.g., 224). Depending on the embodiment, the capacitive circuit (e.g., 210) can comprise a capacitive doubler circuit (e.g., 220), a capacitive divider circuit (e.g., 222), or both. The buck converter (e.g., 212) can comprise a supply voltage input (e.g., 204), a ground input (e.g., 208), and a buck converter voltage output (e.g., 206). For some embodiments, a gate voltage for one of the transistor devices (e.g., 234) of the buck converter (e.g., high-side transistor of the buck converter) can be driven by the output voltage of the capacitive circuit (e.g., 210).

At operation 415, voltage from the buck converter voltage output (e.g., 206) is provided to at least one component of the memory sub-system (e.g., 110), such as a memory device (e.g., 130) or a memory sub-system controller (e.g., 115).

It should be borne in mind, however, that all of these and similar terms are to be associated with the appropriate physical quantities and are merely convenient labels applied to these quantities.

The present disclosure also relates to an apparatus for performing the operations herein. This apparatus can be specially constructed for the intended purposes.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

EXAMPLES

Example 1 is a system that comprises: a capacitor-based power converter that comprises a power supply input, a capacitive circuit coupled to the power supply input, a low-dropout regulator coupled to the capacitive circuit, and a power converter voltage output coupled to the low-dropout regulator; and a buck converter coupled to the power converter voltage output of the capacitor-based power converter, the buck converter comprising a supply voltage input, a ground input, and a buck converter voltage output.

In Example 2, the subject matter of Example 1 optionally includes where the capacitive circuit comprises a capacitive voltage doubler circuit.

In Example 3, the subject matter of Example 1 or Example 2 optionally includes where a first voltage is provided by the supply voltage input, where a second voltage is provided by the power supply input, and where the first voltage is higher than the second voltage.

In Example 4, the subject matter of any one of Examples 1 to 3 optionally includes where the capacitive circuit comprises a capacitive voltage divider circuit.

In Example 5, the subject matter of any one of Examples 1 to 4 optionally includes where a first voltage is provided by the supply voltage input, where a second voltage is provided by the power supply input, and where the first voltage is lower than the second voltage.

In Example 6, the subject matter of any one of Examples 1 to 5 optionally includes where the capacitive circuit comprises a capacitive voltage doubler circuit and a capacitive voltage divider circuit, where a first voltage is provided by the supply voltage input, where a second voltage is provided by the power supply input, and where a third voltage provided by the capacitive circuit to the low-dropout regulator is generated by: the capacitive voltage doubler circuit in response to the first voltage being higher than the second voltage; and the capacitive voltage divider circuit in response to the first voltage being lower than the second voltage.

In Example 7, the subject matter of any one of Examples 1 to 6 optionally includes where the system is part of an integrated circuit.

In Example 8, the subject matter of any one of Examples 1 to 7 optionally includes where the system is part of a memory sub-system.

In Example 9, the subject matter of any one of Examples 1 to 8 optionally includes where the system provides power to a memory sub-system controller.

In Example 10, the subject matter of any one of Examples 1 to 9 optionally includes where the buck converter voltage output provides power to the memory sub-system controller.

In Example 11, the subject matter of any one of Examples 1 to 10 optionally includes where the power supply input provides power to the capacitor-based power converter from a power backup controller of the memory sub-system.

Example 12 is a system that comprises: a memory device; a power interface to receive power from a host system; a power component that receives power from the power interface; and a processing device coupled to the memory device and the power component, the power component comprising: a capacitor-based power converter that comprises a power supply input, a capacitive circuit coupled to the power supply input, a low-dropout regulator coupled to the capacitive circuit, and a power converter voltage output coupled to the low-dropout regulator; and a buck converter coupled to the power converter voltage output of the capacitor-based power converter, the buck converter comprising a supply voltage input, a ground input, and a buck converter voltage output, the processing device receiving power from the buck converter voltage output.

In Example 13, the subject matter of Example 12 optionally includes where the capacitive circuit comprises a capacitive voltage doubler circuit.

In Example 14, the subject matter of Example 12 or Example 13 optionally includes where a first voltage is provided by the supply voltage input, where a second voltage is provided by the power supply input, and where the first voltage is higher than the second voltage.

In Example 15, the subject matter of any one of Examples 12 to 14 optionally includes where the capacitive circuit comprises a capacitive voltage divider circuit.

In Example 16, the subject matter of any one of Examples 12 to 15 optionally includes where a first voltage is provided by the supply voltage input, where a second voltage is provided by the power supply input, and where the first voltage is lower than the second voltage.

In Example 17, the subject matter of any one of Examples 12 to 16 optionally includes where the power component is a power management integrated circuit.

In Example 18, the subject matter of any one of Examples 12 to 17 optionally includes where the system further comprises a power backup controller coupled to the power interface, the power component receiving power from the power interface via the power backup controller.

Example 19 is a method that comprises: receiving, at a memory sub-system, power from a host system via a physical interface of the memory sub-system; providing at least a portion of the power from the host system to a power component of the memory sub-system, the power component comprising: a capacitor-based power converter that comprises a power supply input, a capacitive circuit coupled to the power supply input, a low-dropout regulator coupled to the capacitive circuit, and a power converter voltage output coupled to the low-dropout regulator; and a buck converter coupled to the power converter voltage output of the capacitor-based power converter, the buck converter comprising a supply voltage input, a ground input, and a buck converter voltage output; and providing, from the buck converter voltage output, voltage to at least one component of the memory sub-system.

In Example 20, the subject matter of Example 19 optionally includes where the capacitive circuit comprises at least one of a capacitive voltage doubler circuit or a capacitive voltage divider circuit.

What is claimed is:

1. A system comprising:
   a capacitor-based power converter that comprises a power supply input, a capacitive circuit, coupled to the power supply input, a low-dropout regulator coupled to the capacitive circuit, and a power converter voltage output coupled to the low-dropout regulator, the capacitive circuit comprising a capacitive voltage doubler circuit and a capacitive voltage divider circuit, the capacitive voltage doubler circuit being separate from the capacitive voltage divider circuit; and
   a buck converter coupled to the power converter voltage output of the capacitor-based power converter, the buck converter comprising a supply voltage input, a ground input, and a buck converter voltage output, the supply voltage input providing a first voltage, the power supply input providing a second voltage, and the capacitive circuit generating a third voltage for the low-dropout regulator based on the first voltage being lower or higher than the second voltage.

2. The system of claim 1, wherein the capacitive circuit generates the third voltage by:
   the capacitive voltage doubler circuit in response to the first voltage being higher than the second voltage; and
   the capacitive voltage divider circuit in response to the first voltage being lower than e second voltage.

3. The system of claim 1, wherein the system is part of an integrated circuit.

4. The system of claim 1, wherein the system is part of a memory sub-system.

5. The system of claim 1, wherein the system provides power to a memory sub-system controller.

6. The system of claim 5, wherein the buck converter voltage output provides power to the memory sub-system controller.

7. The system of claim 5, wherein the power supply input provides power to the capacitor-based power converter from a power backup controller of a memory sub-system.

8. A system comprising:
   a memory device;
   a power interface to receive power from a host system;
   a power component that receives power from the power interface; and
   a processing device coupled to the memory device and the power component, the power component comprising:
   a capacitor-based power converter that comprises a power supply input, a capacitive circuit coupled to the power supply input, a low-dropout regulator coupled to the capacitive circuit, and a power converter voltage output coupled to the low-dropout regulator, the capacitive circuit comprising a capacitive voltage doubler circuit and a capacitive voltage divider circuit, the capacitive voltage doubler circuit being separate from the capacitive voltage divider circuit; and
   a buck converter coupled to the power converter voltage output of the capacitor-based power converter, the buck converter comprising a supply voltage input, a ground input, and a buck converter voltage output, the processing device receiving power from the buck converter voltage output, the supply voltage input providing a first voltage, the power supply input providing a second voltage, and the capacitive circuit generating a third voltage for the low-dropout regulator based on the first voltage being lower or higher than the second voltage.

9. The system of claim 8, wherein the power component is a power management integrated circuit.

10. The system of claim 8, further comprising:
    a power backup controller coupled to the power interface, the power component receiving power from the power interface via the power backup controller.

11. The system of claim 8, wherein the capacitive circuit generates the third voltage by:
    the capacitive voltage doubler circuit in response to the first voltage being higher than the second voltage; and
    the capacitive voltage divider circuit in response to the first voltage being lower than the second voltage.

12. A method comprising:
    receiving, at a memory sub-system, power from a host system via a physical interface of the memory sub-system;
    providing at least a portion of the power from the host system to a power component of the memory sub-system, the power component comprising:
    a capacitor-based power converter that comprises a power supply input, a capacitive circuit coupled to the power supply input, a low-dropout regulator coupled to the capacitive circuit, and a power converter voltage output coupled to the low-dropout regulator, the capacitive circuit comprising a capacitive voltage doubler circuit and a capacitive voltage divider circuit, the capacitive voltage doubler circuit being separate from the capacitive voltage divider circuit; and
    a buck converter coupled to the power converter voltage output of the capacitor-based power converter, the buck converter comprising a supply voltage input, a ground input, and a buck converter voltage output, the supply voltage input providing a first voltage, the power supply input providing a second voltage, and the capacitive circuit generating a third voltage for the low-dropout regulator based on the first voltage being lower or higher than the second voltage; and providing, from the buck converter voltage output, voltage to at east one component of the memory sub-system.

13. The method of claim 12, wherein the power component is part of an integrated circuit.

14. The method of claim 12, wherein the power component is a power management integrated circuit.

15. The method of claim 12, wherein the power supply input provides power to the capacitor-based power converter from a power backup controller of a memory sub-system.

16. The method of claim 12, wherein the capacitive circuit generates the third voltage by:
 the capacitive voltage doubler circuit in response to the first voltage being higher than the second voltage; and
 the capacitive voltage divider circuit in response to the first voltage being lower than the second voltage.

\* \* \* \* \*

UNITED STATES PATENT AND TRADEMARK OFFICE
CERTIFICATE OF CORRECTION

PATENT NO. : 11,073,855 B2
APPLICATION NO. : 16/525393
DATED : July 27, 2021
INVENTOR(S) : Matthew D. Rowley It is certified that error appears in the above-identified patent and that said Letters Patent is hereby corrected as shown below:

In the Claims

In Column 11, Line 33, in Claim 1, delete "circuit," and insert --circuit-- therefor In Column 11, Line 55, in Claim 2, delete "e" and insert --the-- therefor In Column 13, Line 2, in Claim 12, delete "east" and insert --least-- therefor Signed and Sealed this
Twentieth Day of September, 2022

*Katherine Kelly Vidal*

Katherine Kelly Vidal
*Director of the United States Patent and Trademark Office*